United States Patent
Umezawa et al.

(10) Patent No.: US 9,966,258 B2
(45) Date of Patent: May 8, 2018

(54) METHOD OF GROWING GALLIUM NITRIDE-BASED CRYSTAL AND HEAT TREATMENT APPARATUS

(71) Applicant: TOKYO ELECTRON LIMITED, Tokyo (JP)

(72) Inventors: Kota Umezawa, Nirasaki (JP); Yosuke Watanabe, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 14/607,591

(22) Filed: Jan. 28, 2015

(65) Prior Publication Data

US 2015/0221512 A1    Aug. 6, 2015

(30) Foreign Application Priority Data

Jan. 31, 2014    (JP) .................. 2014-016790

(51) Int. Cl.
*H01L 21/02* (2006.01)
*C30B 25/10* (2006.01)
(Continued)

(52) U.S. Cl.
CPC ........ *H01L 21/02645* (2013.01); *C30B 25/10* (2013.01); *C30B 25/183* (2013.01);
(Continued)

(58) Field of Classification Search
CPC ... G11C 11/404; G11C 11/4085; H01L 21/84; H01L 27/0688; H01L 28/60;
(Continued)

(56) References Cited

U.S. PATENT DOCUMENTS

| | | | |
|---|---|---|---|
| 5,290,393 A * | 3/1994 | Nakamura | C30B 25/02 117/89 |
| 2005/0028888 A1* | 2/2005 | Sakai | C30B 25/20 148/33 |
| 2008/0220555 A1* | 9/2008 | Saxler | H01L 21/02381 438/47 |

FOREIGN PATENT DOCUMENTS

| JP | 02-141495 A | 5/1990 |
|---|---|---|
| JP | 11-265853 A | 9/1999 |

(Continued)

OTHER PUBLICATIONS

A. J. McGinnis et al., (Journal of Crystal Growth 222 (2001) 452-458, In Situ Cleaning of GaN/6H-SiC substrate in NH3, Recieved Jul. 10, 2000.*

Bae, et al., "Roughness Analysis of GaN Surfaces at Different Annealing Temperatures for an AlN Buffer Layer", Journal of the Korean Physical Society, vol. 51, No. 1, pp. 209-213, Jul. 2007.

*Primary Examiner* — Fernando L Toledo
*Assistant Examiner* — Lawrence-Linh T Nguyen
(74) *Attorney, Agent, or Firm* — Nath, Goldberg & Meyer; Jerald L. Meyer

(57) ABSTRACT

There is provided a method of growing a gallium nitride-based crystal, including: forming an interlayer including aluminum nitride or aluminum oxide on a silicon substrate at a film forming temperature of 350 to 700 degrees C.; heating the silicon substrate and the interlayer in an atmosphere containing ammonia or oxygen such that crystal nuclei of the aluminum nitride or the aluminum oxide included in the interlayer are distributed on the silicon substrate; and growing gallium nitride-based crystals on the silicon substrate from the crystal nuclei distributed on the silicon substrate.

4 Claims, 7 Drawing Sheets

(51) Int. Cl.
*C30B 25/18* (2006.01)
*C30B 29/40* (2006.01)

(52) U.S. Cl.
CPC ........ *C30B 29/406* (2013.01); *H01L 21/0254* (2013.01); *H01L 21/0262* (2013.01); *H01L 21/02381* (2013.01); *H01L 21/02433* (2013.01); *H01L 21/02458* (2013.01); *H01L 21/02483* (2013.01); *H01L 21/02488* (2013.01); *H01L 21/02658* (2013.01)

(58) Field of Classification Search
CPC ......... H01L 27/10873; H01L 27/10891; H01L 27/10897; H01L 27/1207; H01L 27/1085
See application file for complete search history.

(56) References Cited

FOREIGN PATENT DOCUMENTS

| | | |
|---|---|---|
| JP | 2009-038395 A | 2/2009 |
| JP | 2009-152627 A | 7/2009 |
| JP | 2010251738 A | 11/2010 |
| JP | 2012-227265 A | 11/2012 |
| JP | 2014-053412 A | 3/2014 |
| JP | 2014053411 A | 3/2014 |
| KR | 10-2012-0031122 A | 3/2012 |

\* cited by examiner

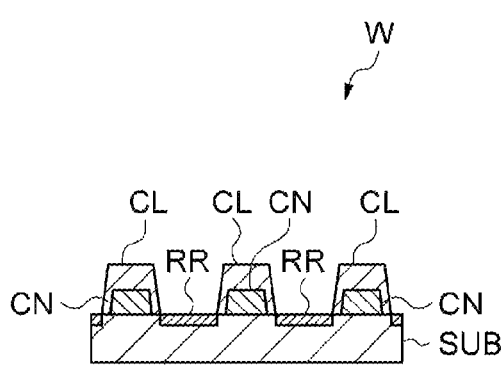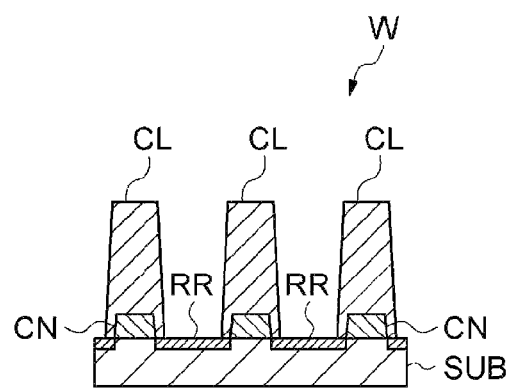

METHOD OF GROWING GALLIUM NITRIDE-BASED CRYSTAL AND HEAT TREATMENT APPARATUS

CROSS-REFERENCE TO RELATED APPLICATION

This application claims the benefit of Japanese Patent Application No. 2014-016790, filed on Jan. 31, 2014, in the Japan Patent Office, the disclosure of which is incorporated herein in its entirety by reference.

TECHNICAL FIELD

The present disclosure relates to a method of growing a gallium nitride-based crystal, and a heat treatment apparatus.

BACKGROUND

Gallium Nitride (GaN) is known as a material constituting a semiconductor device such as a light-emitting device. In general, a sapphire substrate as a base is used in growing a GaN-based crystal. As an example, there is known a method which includes supplying a trimethyl gallium (TMGa) gas and a nitrogen (N) gas into a reaction tube, reacting them with each other on a sapphire substrate which has been heated inside the reaction tube, and forming a GaN crystal layer on the sapphire substrate.

In addition, in order to produce a large-area GaN-based semiconductor device at low cost, a method of growing a GaN-based crystal on a silicon (Si) substrate has been proposed. However, since Si and GaN are highly reactive with each other, direct growth of the GaN-based crystal on the silicon substrate results in a melt back etching, which makes it difficult to grow a high-quality GaN crystal on the silicon substrate. To address this problem, an interlayer having high affinity with both Si and GaN is formed between the silicon substrate and the GaN crystal layer.

Further, there is known a semiconductor device in which an initial buffer region, multi-layer buffer regions and a GaN single crystal layer are sequentially stacked on a silicon substrate. The initial buffer region includes an aluminum nitride (AlN) single crystal layer. The AlN single crystal layer is formed by vapor-growing at 1100 degrees C. using a trimethyl aluminum (TMA) and ammonia ($NH_3$) as raw material gases. In such a semiconductor device, the AlN single crystal layer as an interlayer is formed between a silicon substrate and a GaN crystal layer to prevent the melt back etching.

In the semiconductor device, the AlN single crystal layer is formed at a high film formation temperature to crystalize the aluminum nitride (AlN). However, crystallizing the aluminum nitride (AlN) requires heating the silicon substrate to a temperature close to the melting point. This may melt the silicon substrate depending upon the heating temperature. To address this problem, a process of forming an amorphous AlN film on the silicon substrate at low temperature and growing a GaN single crystal on the amorphous AlN film has been proposed. However, when the amorphous AlN film is formed at a low temperature, the amorphous AlN film is partially crystallized upon growth of the GaN crystal on the AlN film, thereby causing cracking of the AlN film. In this case, the silicon substrate reacts with the GaN through the cracks, which may result in melt back etching.

SUMMARY

Some embodiments of the present disclosure provide a method of growing a gallium nitride-based crystal, which is capable of preventing a melt back etching when the gallium nitride-based crystal is grown on a silicon substrate, and a heat treatment apparatus.

According to one embodiment of the present disclosure, there is provided a method of growing a gallium nitride-based crystal, including: forming an interlayer including aluminum nitride or aluminum oxide on a silicon substrate at a film forming temperature of 350 to 700 degrees C.; heating the silicon substrate and the interlayer in an atmosphere containing ammonia or oxygen such that crystal nuclei of the aluminum nitride or the aluminum oxide included in the interlayer are distributed on the silicon substrate; and growing gallium nitride-based crystals on the silicon substrate from the crystal nuclei distributed on the silicon substrate.

According to another embodiment of the present disclosure, there is provided a heat treatment apparatus, including: a processing container; a gas supply unit configured to supply gases into the processing container; a heat unit configured to heat workpieces received in the processing container; and a controller configured to control the gas supply unit and the heating unit, wherein the controller controls the gas supply unit and the heating unit to: a) supply an aluminum-containing gas and a nitrogen-containing gas or an oxygen-containing gas into the processing container, and heat the workpieces to a temperature of 350 to 700 degrees C.; b) subsequently supply the ammonia-containing gas or the oxygen-containing gas into the processing container and heat the wordpieces; and c) subsequently supply a gallium-containing gas and the nitrogen-containing gas into the processing container and heat the workpieces.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 6A and 6B are sectional views of a workpiece in which GaN-based crystals are grown in a vertical direction in step S4 of the method.

DETAILED DESCRIPTION

Figure 1:
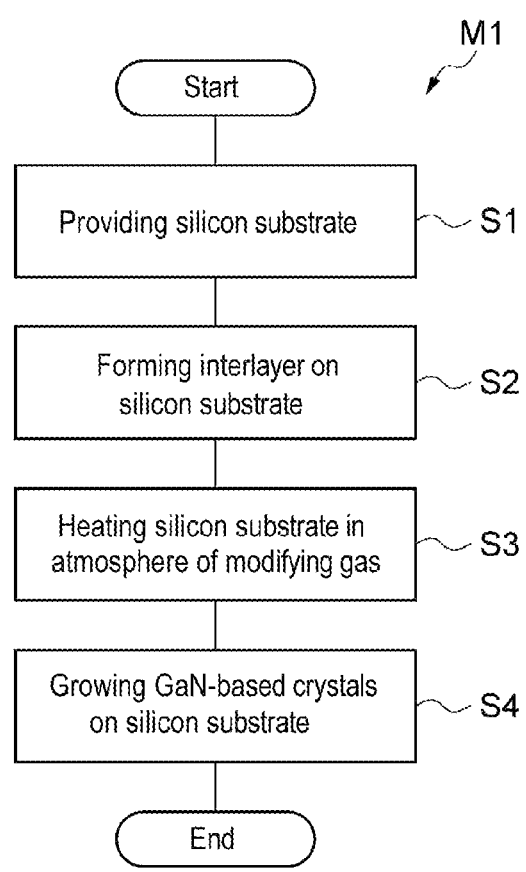
FIG. 1 is a flowchart showing a method of growing a gallium nitride-based crystal according to one embodiment of the present disclosure.

Reference will now be made in detail to various embodiments, examples of which are illustrated in the accompanying drawings. In the drawings, like reference numerals refer to the same or similar configurations and functions and explanation thereof will not be repeated. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a flowchart showing a method M1 of growing a gallium nitride-based crystal according to one embodiment of the present disclosure. The method M1 as shown in FIG. 1 may be used in manufacturing a light-emitting device, a power device or the like, and includes a sequence of steps S1 to S4.

Figure 2:
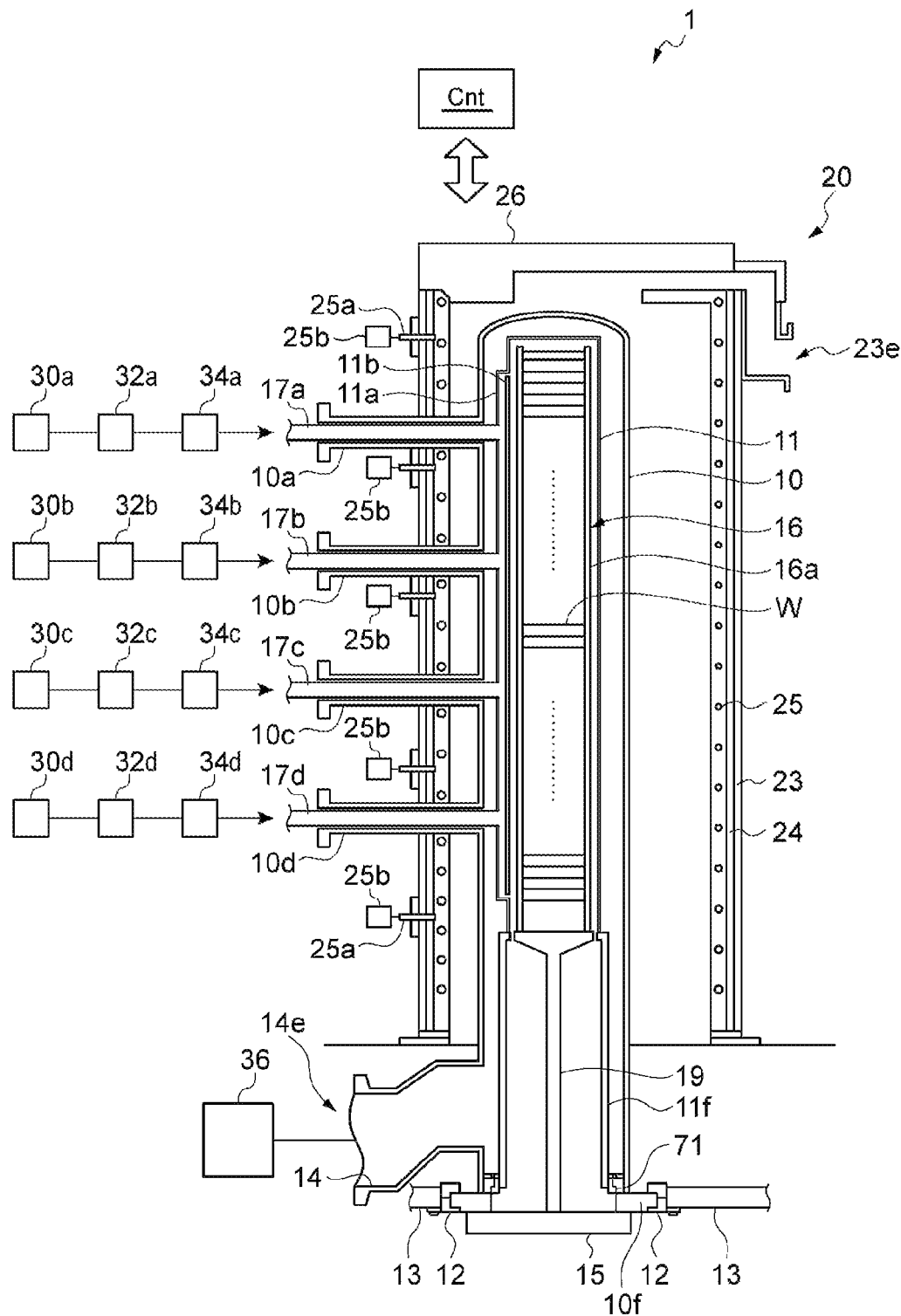
FIG. 2 is a schematic sectional view showing a heat treatment apparatus according to another embodiment of the present disclosure, which is used in performing the gallium nitride-based crystal growth method.

Hereinafter, a heat treatment apparatus 1 which may be employed in performing the method M1 as shown in FIG. 1 will be described. FIG. 2 is a schematic sectional view showing a heat treatment apparatus 1 according to another embodiment of the present disclosure. As shown in FIG. 2, the heat treatment apparatus 1 includes an outer tube 10, an inner tube 11, a wafer support 16, and a heating unit 20.

The outer tube 10 is made of, for example, a quartz glass, and has a cylindrical shape closed at an upper side thereof. A lower portion of the outer tube 10 is opened to form an opening. The lower end of the outer tube 10 is connected to a flange 10f configured to extend from a sidewall of the outer tube 10 to surround the opening of the outer tube 10. The flange 10f is fixed to a base plate 13 by a fixing jig 12.

The inner tube 11 is arranged inside the outer tube 10. The inner tube 11 is used as a processing container in which a plurality of workpieces Ws is received. The inner tube 11 is made of, for example, a quartz glass, and has a cylindrical shape closed at an upper side thereof. A lower portion of the inner tube 11 is opened to form an opening. Holes or slits (not shown) through which the inner tube 11 communicates with the outer tube 10 are formed in a side surface of the inner tube 11. The inner tube 11 further includes an expanded portion 11a which extends outward from the side surface of the inner tube 11. A lower end of the inner tube 11 is connected to a flange 11f which is configured to extend in a vertical direction, i.e. a longitudinal direction of the inner tube 11. The flange 11f is fixed to the flange 10f by a coupling ring 71. Thus, the inner tube 11 is fixed to the outer tube 10. The inner tube 11 may be inserted into the outer tube 10 through the opening formed at the lower portion of the outer tube 10.

The wafer support 16 is received in the inner tube 11. The wafer support 16 includes a plurality of (e.g., at least three) posts 16a which extends in an axial direction of the inner tube 11 at positions equally spaced apart from one another. Each of the plurality of posts 16a includes notches (not shown) formed at approximately regular intervals in a vertical direction. The wafer support 16 supports the workpieces Ws at approximately regular intervals in the axial direction by inserting the workpieces Ws into the respective notches formed in the plurality of posts 16a. In one embodiment, the wafer support 16 may support 117 sheets of the workpieces Ws. Specifically, among 117 sheets of the workpieces Ws, 100 sheets of the workpieces Ws may be defined as objects to be processed Ws and the remaining 17 sheets of workpieces Ws may be defined as dummy wafers. 100 sheets of the workpieces Ws as the objects to be processed are grouped into four groups, each including 25 sheets of the workpieces Ws. The objects (or wafers) to be processed Ws are supported by the wafer support 16 while being separated into the four groups. Four sheets of the dummy wafers are arranged at the uppermost and lowermost sides of the wafer support 16, respectively. Further, three sheets of the dummy wafers are arranged between the respective groups, respectively. The number and arrangement of the workpieces Ws are not limited thereto, and any suitable number and arrangement may be used.

In addition, the wafer support 16 is supported by a support rod 19 from below. The support rod 19 is supported on a housing 15 configured to be moved up and down by an elevating mechanism. By moving the housing 15 up and down using the elevating mechanism, the wafer support 16 can be carried into or out of the inner tube 11 through the opening formed at the lower portion of the inner tube 11. When the housing 15 and the support rod 19 are positioned at the highest positions, the housing 15 is brought into contact with a lower surface of the flange 10f connected to the outer tube 10, thus closing the outer tube 10.

A plurality of (four, in FIG. 2) guide pipes 10a to 10d is connected to the side surface of the outer tube 10 to communicate with the inside of the outer tube 10. The guide pipes 10a to 10d are arranged in a longitudinal direction of the outer tube 10. Gas supply pipes 17a to 17d are inserted into the guide pipes 10a to 10d, respectively. One end of each of the gas supply pipes 17a to 17d is connected to the expanded portion 11a of the inner tube 11 to communicate with the inside of the inner tube 10. The other ends of the gas supply pipes 17a to 17d are coupled to a gas source group 30 through a series of a valve group 34 and a flow controller group 32, respectively. The gas supply pipes 17a to 17d are configured to supply gases provided from the gas source group 30 to the respective groups of the workpieces Ws received in the inner tube 11.

Figure 3:
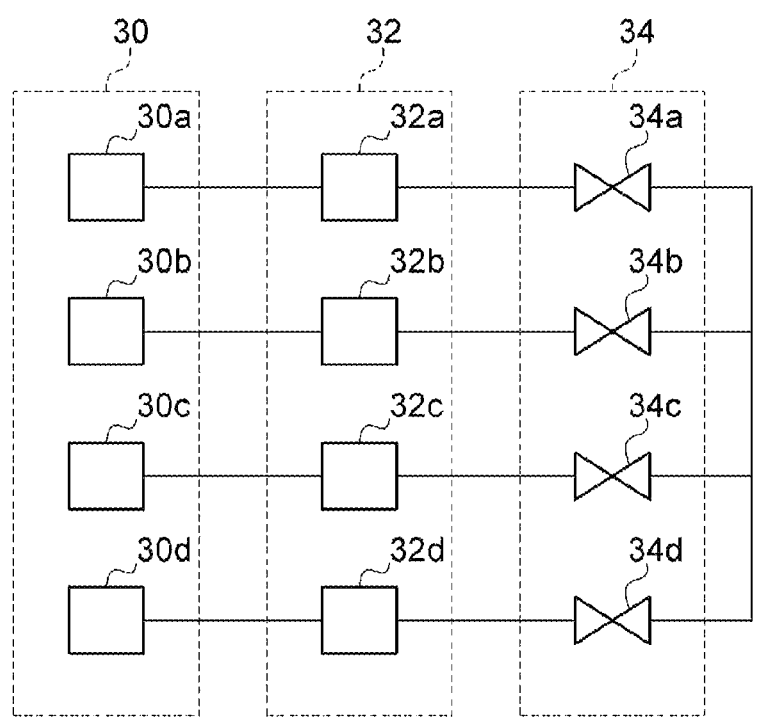
FIG. 3 is a detailed view of a valve group, a flow controller group, and a gas source group in FIG. 2.

FIG. 3 is a detailed view of the valve group 34, the flow controller group 32, and the gas source group 30 shown in FIG. 2. As shown in FIG. 3, the gas source group 30 includes a plurality of (e.g., four) gas sources 30a to 30d. The gas sources 30a to 30d are configured to supply an aluminum (Al)-containing gas, a gallium (Ga)-containing gas, a nitrogen-containing gas, and an oxygen-containing gas, respectively. Examples of the Al-containing gas may include a trimethyl aluminum (TMAl) gas. Examples of the gallium (Ga)-containing gas may include a trichloro gallium ($GaCl_3$) gas, a trimethyl gallium (TMGa) gas and a triethyl gallium (TEGa) gas. Examples of the nitrogen-containing gas may include an ammonia ($NH_3$) gas or nitrogen ($N_2$) gas. Examples of the oxygen-containing gas may include an $O_2$ gas, an ozone ($O_3$) gas, and a mixture of $O_2$ and $H_2$ gases.

The flow controller group 32 includes a plurality of (e.g., four) flow controllers 32a to 32d. The flow controllers 32a to 32d of the flow controller group 32 are configured to control flow rates of respective gases supplied from the respective gas sources 30a to 30d. In some embodiments, each of the flow controllers 32a to 32d may be a mass flow controller (MFC) or a flow control system (FCS). The valve group 34 includes a plurality of (e.g., four) valves 34a to 34d. The gas sources 30a to 30d are coupled to the gas supply pipes 17a to 17d through the flow controllers 32a to 32d and the valve 34a to 34d, respectively. Each of the gases supplied from the gas sources 30a to 30d is introduced into the inner tube 11 through the one end of each of the gas supply pipes 17a to 17d. The gas source group 30, the flow controller group 32, and the valve group 34 constitute a gas supply unit configured to supply the gases into the inner tube 11. In one embodiment, the gas supply unit may further include other gas sources than the gas source 30a to 30d.

As shown in FIG. 2, a gas diffusion plate 11b is arranged between the expanded portion 11a and the wafer support 16. The gas diffusion plate 11b may be a plate-shaped member formed of, for example, a quartz glass. A plurality of slits (not shown), which passes through the gas diffusion plate 11b in a thickness direction, is formed at positions facing the one end of each of the gas supply pipes 17a to 17d in the gas diffusion plate 11b, respectively. The gas supplied from each of the gas sources 30a to 30d toward the inner tube 11 through the respective gas supply pipes 17a to 17d is diffused through the silts of the gas diffusion plate 11b, thereby improving uniformity of the diffusion of the gas into the inner tube 11.

In addition, an exhaust port 14e is formed in the lower portion of the outer tube 10. Through the exhaust port 14e, the gases supplied into the outer tube 10 through a series of the gas supply pipes 17a to 17d and the slits formed in the inner tube 11 are exhausted. An exhaust device 36 is connected to the exhaust port 14e through an exhaust pipe 14. The exhaust device 36 includes a vacuum pump such as a turbo molecular pump which is configured to depressurize the outer tube 10 and the inner tube 11 to a desired degree of vacuum.

The heating unit 20 includes a cylindrical part 23, an insulation part 24, a heat generating part 24, and a cover part 26. The heating unit 20 is used to heat the workpieces Ws received in the inner tube 11. The cylindrical part 23 has a cylindrical shape and is disposed to surround an outside of the outer tube 10. In some embodiments, the cylindrical part 23 may be disposed such that a side at which the guide pipes 10a to 10d of the outer tube 10 are formed is closer to an inner circumferential surface of the cylindrical part 23 than a side at which the guide pipes 10a to 10d of the outer tube 10 are not formed. The insulation part 24 is arranged along the inner circumferential surface of the cylindrical part 23. The heat generating part 25 is arranged within the insulation part 24. The heat generating part 25 is electrically connected to current input terminals 25a disposed in an outer circumferential surface of the cylindrical part 23. A plurality of heater power sources 25b supplies an electric power to the heat generating part 25 through the respective current input terminals 25a such that the heat generating part 25 generates heat. The cover part 26 covers an upper portion of the cylindrical part 23. In addition, an exhaust port 23e is formed between the cylindrical part 23 and the cover part 26. Through the exhaust port 23e, air heated by the heat generating part 25 within the cylindrical part 23 is discharged outside.

In some embodiments, the heat treatment apparatus 1 may further include a controller Cnt. The controller Cnt is a computer including a processor, a memory, an input device, a display and the like, and controls each component of the heat treatment apparatus 1. The controller Cnt allows an operator to perform a command input operation and the like so as to manage the heat treatment apparatus 1 through the input device. In addition, the controller Cnt may visualize and display the running situations of the heat treatment apparatus 1 through the display. Further, the memory of the controller Cnt stores control programs for realizing various processes to be executed in the heat treatment apparatus 1 under control of the processor, or programs, i.e., processing recipes, for causing various components of the heat treatment apparatus 1 to perform their respective processes depending on their respective processing conditions.

Specifically, the controller Cnt sends control signals to the flow controller group 32, the valve group 34, the exhaust device 36 and the heater power sources 25b such that a flow rate of each of the gases which are supplied into the inner tube 11, an internal pressure and temperature of the inner tube 11 are kept at predetermined values, respectively, in each step of the method M1.

Figure 4A:
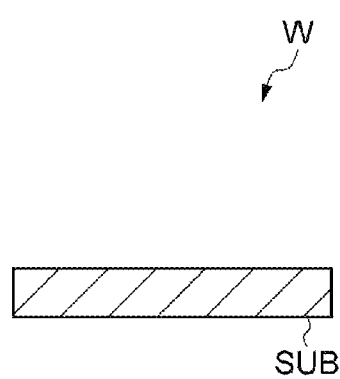
FIG. 4A is a sectional view of a silicon substrate prepared in step S1 of the method.

The gallium nitride-based crystal growth method M1 according to one embodiment will be described with reference to FIG. 1 again. In step S1 of the method M1, a silicon substrate SUB is prepared, as shown in FIG. 4A. The silicon substrate SUB may be a single crystal silicon substrate, a main surface of which having a plane orientation of (111). The silicon substrate SUB is carried into the heat treatment apparatus 1 and is supported by the wafer support 16. Hereinafter, the silicon substrate SUB and elements formed thereon are collectively referred to as a workpiece W.

Figure 4B:
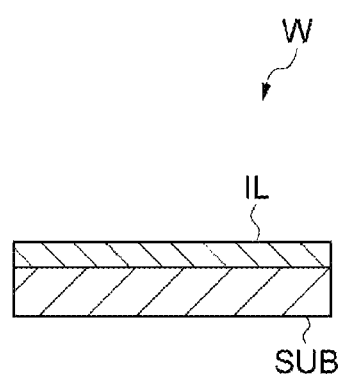
FIG. 4B is a sectional view of a workpiece in which an interlayer is formed on the silicon substrate in step S2 of the method.

Thereafter, in step S2, an interlayer IL is formed on the silicon substrate SUB, as shown in FIG. 4B. The interlayer IL includes an aluminum nitride (AlN) or an aluminum oxide ($AlO_3$). In step S2, the controller Cnt controls the gas source group 30 to supply the Al-containing gas and the nitrogen-containing gas (for example, $N_2$ gas or $NH_2$ gas) or the oxygen-containing gas (for example, $O_2$ gas) into the inner tube 11. The supplied gases react with each other on the silicon substrate SUB supported by the wafer support 16, thus forming the interlayer IL on the silicon substrate SUB. Here, the interlayer IL is formed at a relatively low temperature ranging from 350 to 700 degrees C., and includes amorphous AlN or $AlO_3$.

Figure 4C:
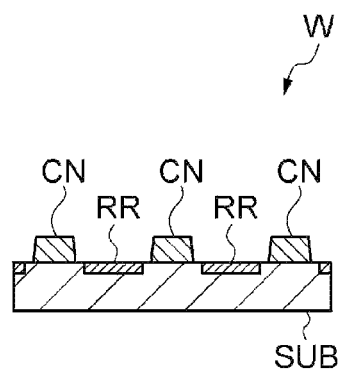
FIG. 4C is a sectional view of the workpiece which has been subjected to a heating process in step S3 of the method.
Figure 5:
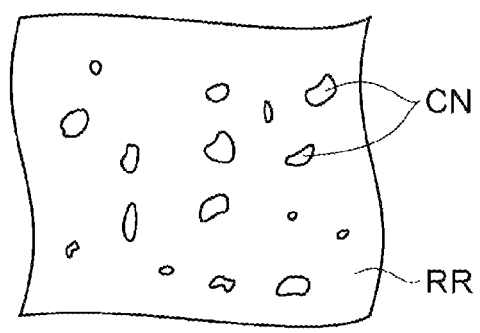
FIG. 5 is an enlarged plane view of the silicon substrate, which shows distribution of crystal nuclei.

Thereafter, step S3 is performed. In step S3, the controller Cnt controls the gas source group 30 to supply the nitrogen-containing gas or the oxygen-containing gas into the inner tube 11 and controls the heating unit 20 to increase the internal temperature of the inner tube 11. The nitrogen-containing gas or the oxygen-containing gas supplied into the inner tube 11 is used as a modifying gas for modifying the surface of the silicon substrate SUB. In step S3, the workpiece W is heated in an atmosphere containing, for example, $NH_3$ or $O_2$. This crystallizes the aluminum nitride or the aluminum oxide contained in the interlayer IL, thus causing a volumetric contraction. As a result, as shown in FIG. 4C, crystal nuclei CNs of the aluminum nitride or the aluminum oxide are generated on the silicon substrate SUB. The crystal nuclei CNs are distributed on the silicon substrate SUB at a density determined by process conditions, as shown in FIG. 5. The density of the crystal nuclei CNs depends upon the heating temperature of the silicon substrate SUB in step S3 and the internal pressure of the inner tube 11. In some embodiments, the heating temperature of the silicon substrate SUB in step S3 may be set to a range of 900 to 1000 degrees C., and the internal pressure of the inner tube 11 may be set to a range of 1 Torr ($1.33 \times 10^2$ Pa) to 400 Torr ($4.33 \times 10^4$ Pa).

The generation of the crystal nuclei CNs partially exposes the surface of the silicon substrate SUB. Such exposed portions react with the modifying gas such as $NH_3$ or $O_2$, thus being subjected to a nitriding or oxidizing process. As a result, modified regions RRs composed of the silicon nitride (SiN) or the silicon oxide (SiO) are formed in a region of the silicon substrate SUB in which the crystal nuclei CNs are not generated.

Thereafter, in step S4, GaN-based crystals are grown on the silicon substrate SUB. To do this, in step S4, the controller Cnt controls the gas source group 30 to supply the Ga-containing gas such as $GaCl_3$, and the nitrogen-containing gas (for example, $N_2$ gas or $NH_3$ gas) into the inner tube 11 such that the internal pressure of the inner tube 11 is set to a predetermined value. In addition, the workpieces Ws are heated to a crystal growth temperature of GaN by the heating unit 20. Here, in a high temperature environment such as the growth temperature of the GaN-based crystals, the GaN-based crystals are grown in regions other than the silicon nitride and the silicon oxide. Thus, in step S4, the GaN-based crystals grow from the crystal nuclei CNs except the modified regions RR of the silicon substrate SUB. With this configuration, since the GaN-based crystals grow from the crystal nuclei CNs, reaction of the silicon substrate SUB with the GaN-based crystals is suppressed. This suppresses a melt back etching. In addition, in the method M1, since the GaN-based crystals grow from the crystal nuclei CNs distributed on the silicon substrate SUB, it is possible to grow the GaN-based crystals having a large particle diameter. When the $GaCl_3$ gas is used as the Ga-containing gas, the surface of the silicon substrate SUB may be etched by an active species of chlorine. However, in the method M1, since the surface of the silicon substrate SUB has been modified, it is possible to prevent the surface of the silicon substrate SUB from being etched by the active species of chlorine.

In some embodiments, a growth direction of the GaN-based crystals may be controlled by adjusting a growth temperature and pressure of the GaN-based crystals. Specifically, a vertical growth of the GaN-based crystals is promoted with a decrease in the growth temperature of the GaN-based crystals or an increase in the growth pressure of the GaN-based crystals. FIGS. 6A and 6B are sectional views of a workpiece in which GaN-based crystals are grown in a height direction in step S4. First, GaN-based crystals CLs individually grow from respective crystal nuclei CNs (see FIG. 6A). Subsequently, a plurality of columnar GaN-based crystals CLs, while being spaced apart from one another, is formed on the silicon substrate SUB in the height direction (see FIG. 6B).

Figure 7A:
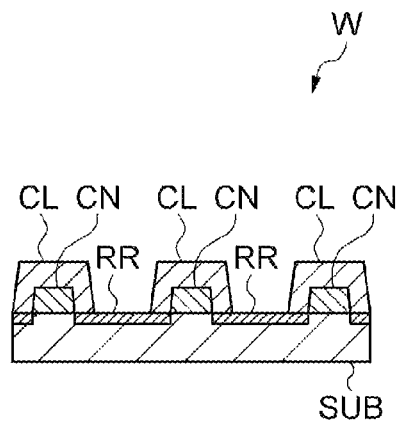
FIGS. 7A to 7C are sectional views of a workpiece in which GaN-based crystals are grown in a lateral direction in step S4 of the method.
Figure 7B:
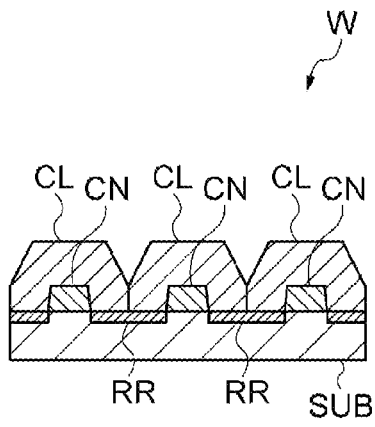
Figure 7C:
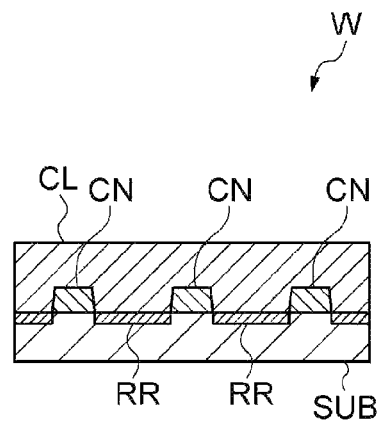

On the other hand, a lateral growth of the GaN-based crystals is promoted with an increase in the growth temperature of the GaN-based crystals or a decrease in the growth pressure of the GaN-based crystals. FIGS. 7A to 7C are sectional views of a workpiece in which GaN-based crystals are grown in a lateral direction in step S4. First, a plurality of GaN-based crystals CLs individually grow from respective crystal nuclei CNs in the lateral direction (see FIG. 7A). Subsequently, the grown GaN-based crystals CLs are brought into contact with each other (see FIG. 7B). Finally, a film of the GaN-based crystals CLs which substantially covers the entire surface of the silicon substrate SUB is formed (see FIG. 7C).

In some embodiments, the method M1 may be implemented using other apparatuses than the heat treatment apparatus 1 shown in FIG. 2. As an example, in step S2, the interlayer IL may be formed using another ALD or CVD apparatus instead of the heat treatment apparatus 1.

Furthermore, the GaN-based crystals formed on the silicon substrate SUB in step S4 means a crystal containing at least GaN, but may be a crystal containing other compounds. As an example, the GaN-based crystal may contain a GaN-based crystal and an AlGaN-based crystal.

As described above, the interlayer is formed on the silicon substrate at a relatively low temperature ranging from 350 to 700 degrees C. The interlayer includes an amorphous aluminum nitride or an amorphous aluminum oxide. Thereafter, the silicon substrate is heated in an atmosphere containing ammonia or oxygen so that crystal nuclei composed of the aluminum nitride or the aluminum oxide are formed on the silicon substrate. At this time, the interlayer is crystallized so that a volumetric contraction is caused. This exposes a portion of the silicon substrate. Such exposed portions of the silicon substrate react with ammonia or oxygen, thus being modified into nitrided or oxidized regions. Subsequently, GaN-based crystals are grown on the silicon substrate. Here, in a high temperature environment such as a growth temperature of the GaN-based crystals, the GaN-based crystals are grown in regions other than the silicon nitride and the silicon oxide. Thus, the GaN-based crystals grow from the crystal nuclei and not from the modified regions of the silicon substrate. As described above, according to the method, since the GaN-based crystals grow from the crystal nuclei, reaction of the silicon substrate with the GaN-based crystals is suppressed. This prevents a melt back etching from being generated.

Further, a density of the crystal nuclei formed on the silicon substrate depends upon the heating temperature of the silicon substrate. In this embodiment, the silicon substrate is heated at a temperature ranging from 900 to 1000 degrees C. Accordingly, the density of the crystal nuclei can be set to a density at which high-quality GaN crystals can be formed.

Further, the density of the crystal nuclei formed on the silicon substrate depends upon a pressure applied when the crystal nuclei are formed. In this embodiment, the silicon substrate is heated at a pressure ranging from 1 Torr to 400 Torr. Accordingly, the density of the crystal nuclei can be set to a density at which high-quality GaN crystals can be formed.

According to the present disclosure in some embodiments, it is possible to provide a method of growing a gallium nitride-based crystal, which is capable of preventing a melt back etching when the gallium nitride-based crystals are grown on the silicon substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of growing a gallium nitride-based crystal, comprising:
   forming an interlayer including aluminum nitride or aluminum oxide on a silicon substrate at a film forming temperature of 350 to 700 degrees C.;
   heating the silicon substrate and the interlayer in an atmosphere containing ammonia or oxygen, after forming the interlayer, to crystallize the aluminum nitride or the aluminum oxide included in the interlayer such that crystal nuclei of the aluminum nitride or the aluminum oxide included in the interlayer are distributed on the silicon substrate, and to modify portions of the silicon substrate to which the crystal nuclei are not distributed into silicon nitrided or silicon oxidized regions; and
   growing gallium nitride-based crystals on the silicon substrate from the crystal nuclei distributed on the silicon substrate.

2. The method of claim 1, wherein the silicon substrate and the interlayer are heated to a temperature of 900 to 1000 degrees C.

3. The method of claim 1, wherein the silicon substrate and the interlayer are heated at a pressure of 1 to 400 Torr.

4. A heat treatment apparatus, comprising:
a processing container;
a gas supply unit configured to supply gases into the processing container;
a heat unit configured to heat workpieces received in the processing container, and
to modify portions of the silicon substrate to which the crystal nuclei are not distributed into silicon nitrided or silicon oxidized regions; and
a controller configured to control the gas supply unit and the heating unit, wherein the controller controls the gas supply unit and the heating unit to:
a) supply an aluminum-containing gas and a nitrogen-containing gas or an oxygen-containing gas into the processing container, and heat the workpieces to a temperature of 350 to 700 degrees C.;
b) subsequently supply the ammonia-containing gas or the oxygen-containing gas into the processing container and heat the workpieces; and
c) subsequently supply a gallium-containing gas and the nitrogen-containing gas into the processing container and heat the workpieces.

\* \* \* \* \*